(12) United States Patent
Zhang et al.

(10) Patent No.: US 8,010,071 B2
(45) Date of Patent: Aug. 30, 2011

(54) INTEGRATED SQUELCH CIRCUIT WITH PROGRAMMABLE ENGAGEMENT THRESHOLD

(75) Inventors: Pengfei Zhang, Shanghai (CN); Caogang Yu, Shanghai (CN)

(73) Assignee: Beken Corporation, Shanghai (CN)

( * ) Notice: Subject to any disclaimer, the term of this patent is extended or adjusted under 35 U.S.C. 154(b) by 525 days.

(21) Appl. No.: 12/330,473

(22) Filed: Dec. 8, 2008

(65) Prior Publication Data

US 2010/0130149 A1    May 27, 2010

(30) Foreign Application Priority Data

Nov. 27, 2008   (CN) .......................... 2008 1 0044015

(51) Int. Cl.
*H04B 1/10* (2006.01)
(52) U.S. Cl. ...................................................... 455/219
(58) Field of Classification Search .................. 455/212, 455/213, 218, 219, 220, 221, 222, 225
See application file for complete search history.

(56) References Cited

U.S. PATENT DOCUMENTS

| | | | | |
|---|---|---|---|---|
| 4,847,897 A | * | 7/1989 | Means | 379/390.01 |
| 5,459,786 A | * | 10/1995 | Tomiyori et al. | 379/390.01 |
| 6,456,833 B1 | * | 9/2002 | Sessink | 455/212 |

OTHER PUBLICATIONS

"Adding Extra Hysteresis to Comparators," Maxim, Aug. 29, 2005, http://www.maxim-ic.com/appnotes.cfm/an_pk/3616 [Last Accessed May 26, 2010], 8 pages.
"Dynamics processors: Noise gates (downward expander)," Doctor ProAudio, Copyright 2001-2006, http://www.doctorproaudio.com/doctor/temas/dynamics-processors-noisegates_en.shtml [Last Accessed May 26, 2010], 6 pages.
"Squelch," Wikipedia, http://en.wikipedia.org/wiki/Squelch [Last Accessed May 26, 2010], 3 pages.

* cited by examiner

*Primary Examiner* — Jeffrey Zweizig
(74) *Attorney, Agent, or Firm* — Perkins Coie LLP

(57) ABSTRACT

A method, system, and apparatus for squelching a signal in telecommunications systems. The apparatus includes a filter, two power detectors, a divider, two comparators, a logic gate, and a gain control block. The apparatus receives an input signal, and the power of the signal is detected. The input signal is also filtered to pass only the noise portion of the signal, and the power of the filtered signal is detected. A ratio between the filtered signal power and the input signal power is determined. A first comparator receives the filtered signal power and a second comparator receives the ratio of the filtered signal power and the input signal power. The logic gate receives the outputs from the first and second comparators. The gain control block receives as inputs the logic gate's output and the input signal to the apparatus. The gain control block may attenuate the input signal based on the logic gate's output. The gain control block generates the output signal of the apparatus.

20 Claims, 7 Drawing Sheets

INTEGRATED SQUELCH CIRCUIT WITH PROGRAMMABLE ENGAGEMENT THRESHOLD

CROSS-REFERENCE TO RELATED APPLICATION

This application claims priority to Chinese Patent Application No. 200810044015.2, filed Nov. 27, 2008, the disclosure of which is hereby incorporated by reference in its entirety.

TECHNICAL FIELD

The present disclosure is related to methods and apparatus for squelching a received signal in a telecommunications system.

BACKGROUND

In telecommunications systems, it is often desired that a received audio signal be squelched, i.e. suppressed, in the absence of a sufficiently strong desired signal. As an example, in a cordless telephone system, a user of a cordless phone may be a long distance away from the phone's base station when placing a call. A long distance between phone and base station may degrade the wireless signals that are transferred between the phone and base station. In such circumstances, a cordless phone lacking a squelch system would likely output only static or other displeasing noise to the user. In order to enhance the user's experience, a system which squelches the received audio in the absence of a sufficient signal may be employed in the user's cordless phone.

Existing squelch systems may operate by receiving an audio signal, determining the power of out-of-band noise, and utilizing a comparator to determine whether the noise is beyond a certain threshold. If the noise power is beyond the threshold, the system would squelch the audio signal. Similarly, other existing systems may detect the power of out-of-band noise and the power of the audio band signal, and again utilize a comparator to determine whether to squelch the signal. Problems exist with such systems. For example, the former system does not provide the needed control resolution for a high quality audio system and the latter system discriminates unfairly against a received signal with a low audio level but a sufficient carrier-to-noise ratio. Furthermore, these existing systems require power detectors that are not suitable for on-chip integration, and are therefore costly and require a relatively large amount of power to operate. Therefore, it would be useful to have a squelch system that provides finer resolution in the selection of a squelch engagement threshold. It would also be useful to have a squelch system that does not discriminate against a user with a quiet voice. Additionally, it would also be useful to have a squelch system that can be implemented in a mixed-signal DSP environment, which could easily be integrated into a CMOS process.

DETAILED DESCRIPTION

The following disclosure describes several embodiments of methods and apparatus for squelching a received signal. Several details describing well-known structures or processes often associated with squelch systems are not set forth in the following description for purposes of brevity and clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1-6. The terminology used in the description presented below is intended to be interpreted in its broadest reasonable manner, even though it is being used in conjunction with a detailed description of certain specific embodiments of the invention.

Figure 1:
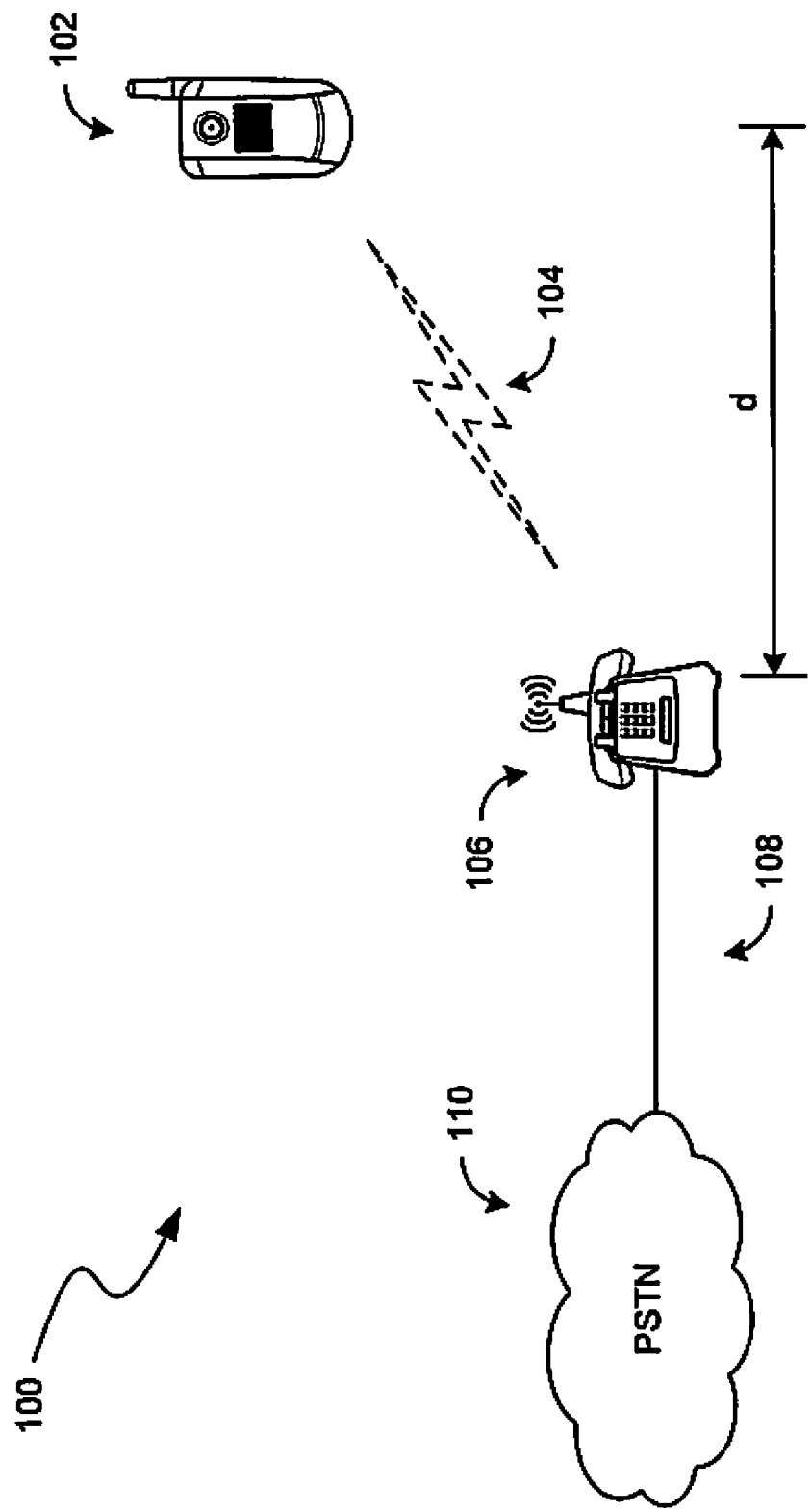
FIG. 1 is a diagram of a representative environment in which a device utilizing a squelch circuit operates consistent with a first embodiment of the invention.

FIG. 1 is a block diagram of an environment 100 in which a device 102 utilizing a squelch system consistent with a first embodiment of the invention operates. The environment includes at least one cordless telephone handset 102, which is connected to a cordless telephone base station 106 through a wireless connection 104. The wireless connection 104 could be implemented using any system for transmitting data in a digital format, such as the Digital Enhanced Cordless Telephone (DECT) standard for cordless phone communication. The cordless telephone handset 102 and the cordless telephone base station 106 include digital components to receive and process the audio signal. The cordless telephone base station 106 connects through a wired connection 108 to a telephone network 110. In the embodiment shown in FIG. 1, the telephone network 110 is the public switched telephone network (PSTN), but the base station could also connect to a private branch exchange (PBX) or to a packet-switched network providing Voice over Internet Protocol (VoIP) services. Similarly, the wireless connection 104 and the wired connection 108 could be either wired or wireless connections. Alternatively, the wireless connection 104 could be implemented using a system for transmitting an analog signal, and the cordless telephone handset 102, cordless telephone base station 106, and their respective components, could include analog components to receive and process the audio signal. In general, any system which transmits or receives a wireless signal, such as wireless video, data, or other signals, could benefit from a squelch system.

In the embodiment of FIG. 1, the squelch system may operate after the cordless telephone handset 102 receives a signal from the cordless telephone base station 106. As an example, the squelch system may suppress the received signal if the signal is too degraded for its intended purpose. Such signal degradation may occur, for example, if the physical distance d between the cordless telephone handset 102 and the cordless telephone base station 106 is too large. The cordless telephone handset 102 may demodulate the received signal before utilizing the squelch system.

Figure 2:
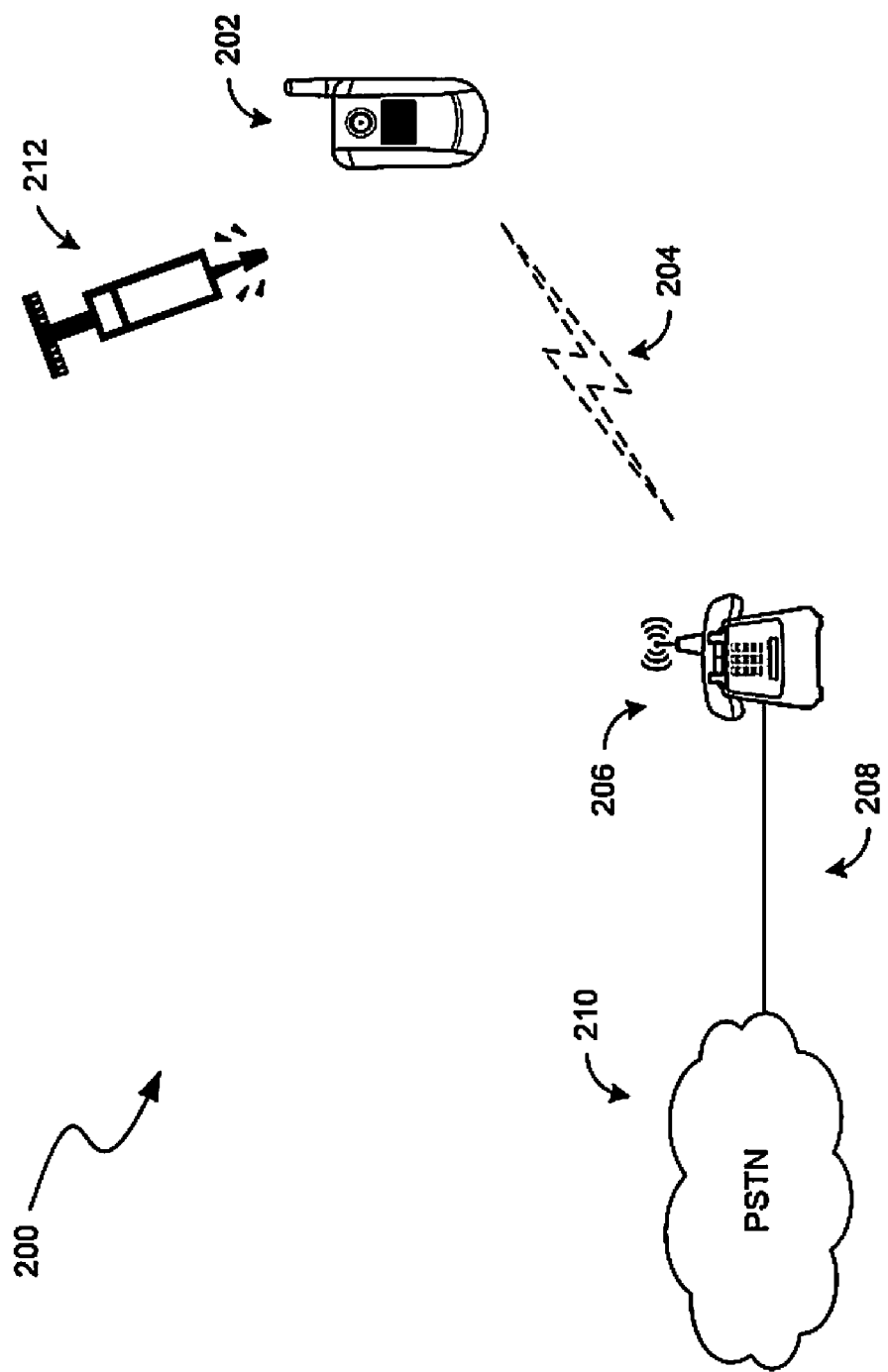
FIG. 2 is a diagram of a representative environment in which a device utilizing a squelch circuit operates consistent with another embodiment of the invention.

FIG. 2 is a block diagram of an environment 200 in which a device 202 utilizing an alternative embodiment of the squelch system operates. The components of the environment 200, such as the cordless telephone handset 202 and cordless telephone base station 206, are comparable to those described with reference to FIG. 1. Similarly, the connections, such as the wireless connection 204 and the wired connection 208, are comparable to those described with reference to FIG. 1. The squelch system, however, may operate to squelch signals other than those sent by the cordless telephone base station 206. As an example, the squelch system may operate to squelch the audio signal received by the cordless telephone handset's 202 microphone. Such squelching may be desired during a voice conversation, for example, because a cordless telephone handset's 202 microphone has received high frequency noise beyond a human's vocal range. The cordless telephone handset's 202 microphone, for example, may receive noise produced by a jackhammer 212. The cordless telephone handset 202 may suppress the jackhammer 212 noise using the squelch system before the cordless telephone handset 202 transmits a signal over the wireless connection 204 to the cordless telephone base station 206. Alternatively, the squelch system may be placed elsewhere in the communications system to squelch signals, such as at the cordless telephone base station 206.

Figure 3:
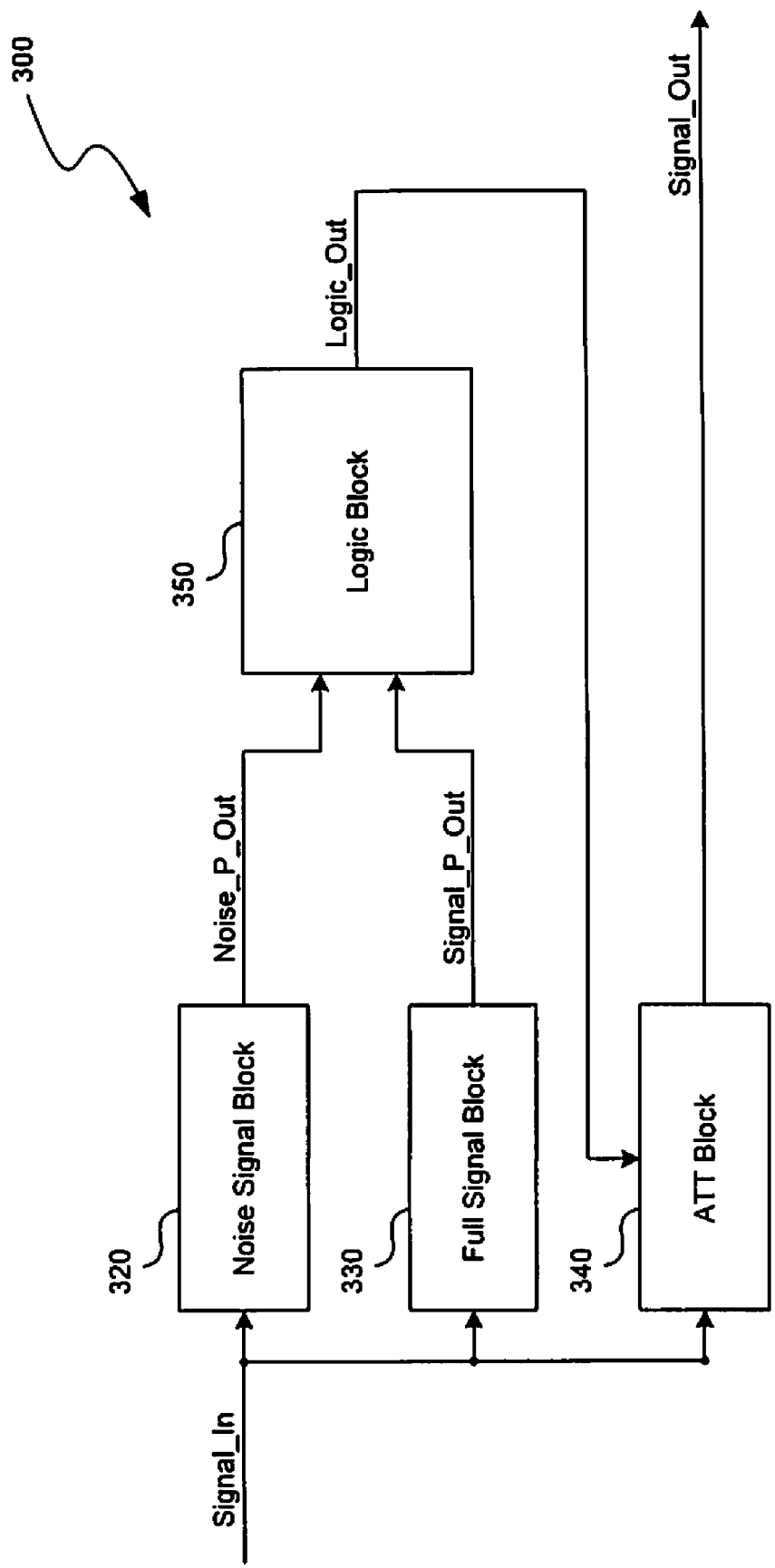
FIG. 3 is a block diagram of a squelch system in accordance with an embodiment of the invention.

FIG. 3 is a block diagram of a squelch system 300 suitable for use in the telecommunications environments 100 and 200 from FIGS. 1 and 2. With respect to FIG. 1, the squelch system 300 may be utilized after the cordless telephone handset 102 receives an audio signal from the cordless telephone base station 206. With respect to FIG. 2, the squelch system 300 may be employed after the cordless telephone handset's 202 microphone receives an audio signal. Alternatively, the squelch system 300 may be employed elsewhere in the telecommunications environments 100 and 200 from FIGS. 1 and 2. The audio signal may be processed before reaching the squelch system.

The squelch system 300 according to one embodiment of the invention contains four main portions: a noise signal block 320, a full signal block 330, an ATT block 340, and a logic block 350. The squelch system 300 receives audio signal SIGNAL_IN. SIGNAL_IN is connected to the noise signal block 320, to the full signal block 330, and to the ATT block 340. The noise signal block 320 processes SIGNAL_IN and outputs SIGNAL_IN's noise power, NOISE_P_OUT. Similarly, the full signal block 330 processes SIGNAL_IN and outputs the power of the entire signal, SIGNAL_P_OUT. The logic block 350 receives signal NOISE_P_OUT and signal SIGNAL_P_OUT as inputs and generates a control signal LOGIC_OUT that is used as an input to the ATT block 340. The ATT block 340 is a gain control block with programmable gain. As an example, the ATT block 340 may have programmable gain from −40 dB to 0 dB in 2 dB steps in order to provide an appropriate attenuate for SIGNAL_IN depending on the squelch system's 300 application. The ATT block 340 receives SIGNAL_IN and LOGIC_OUT and outputs SIGNAL_OUT. The noise signal block 320, the full signal block 330, and the logic block 350 are explained in greater detail below and in FIGS. 4-6.

Figure 4:
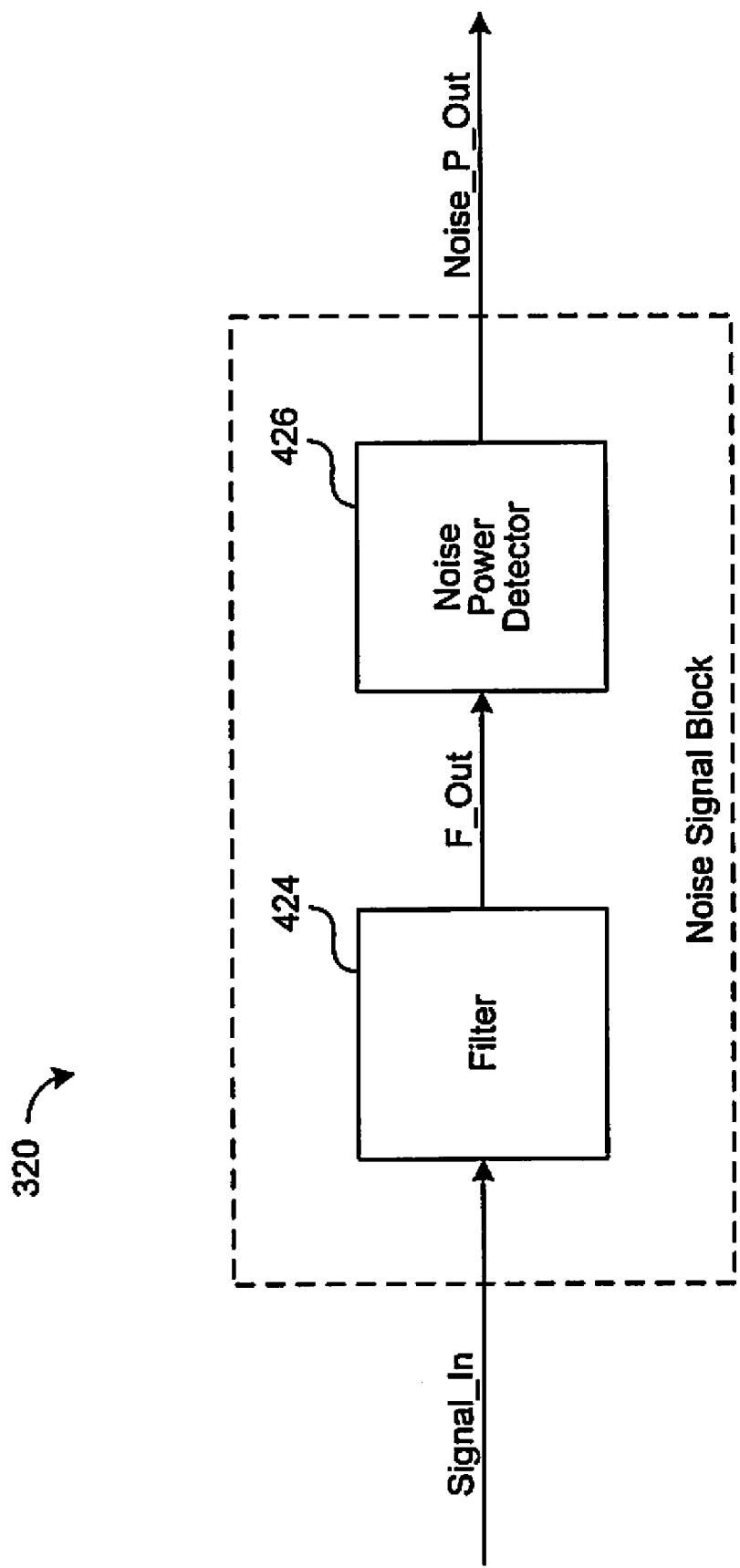
FIG. 4 is a block diagram of a noise signal block of the squelch system from FIG. 2 in accordance with an embodiment of the invention.

FIG. 4 is a block diagram of a noise signal block 320 suitable for use in a squelch system 300 consistent with an embodiment of the invention. As discussed with reference to FIG. 3, the noise signal block 320 receives SIGNAL_IN as an input and generates signal NOISE_P_OUT, which is the power of the noise signal. The noise signal block 320 includes filter 424 and power detector 426. Filter 424 is configured to receive SIGNAL_IN and generate filtered signal F_OUT. Filter 424 may also be configured to scale SIGNAL_IN prior to filtration. For example, filter 424 may be configured to multiply SIGNAL_IN by a scaling factor prior to filtration. Likewise, the gain of filter 424 may provide a non-unity gain such that SIGNAL_IN is scaled during filtration instead of being scaled prior to filtration.

According to one embodiment, filter 424 is a band-pass filter with passband frequency from, for example, 10 kHz to 30 kHz. However, any other suitable passband may be employed. In another embodiment, filter 424 may include a low-pass filter that is configured to reject high frequency signals and to allow low frequency signals to pass through as filtered signal F_OUT. In one embodiment, filter 424 includes an infinite impulse response (IIR) filter such as a Chebyshev filter, a Bessel filter, a Butterworth filter, an elliptic filter, and/or the like. However, any other suitable filters may be employed. For example, a RC filter, an LC filter, a finite impulse response filter, a SAW filter, and/or the like, may be employed instead of an IIR filter. Filter 424 may be adjusted to pass any desired frequency. In one embodiment, filter 424 passes the noise portion of SIGNAL_IN. The frequency range of the noise portion of SIGNAL_IN will vary depending on the application of the squelch system 300. In another embodiment, filter 424 passes the signal portion and filters the noise.

Figure 5:
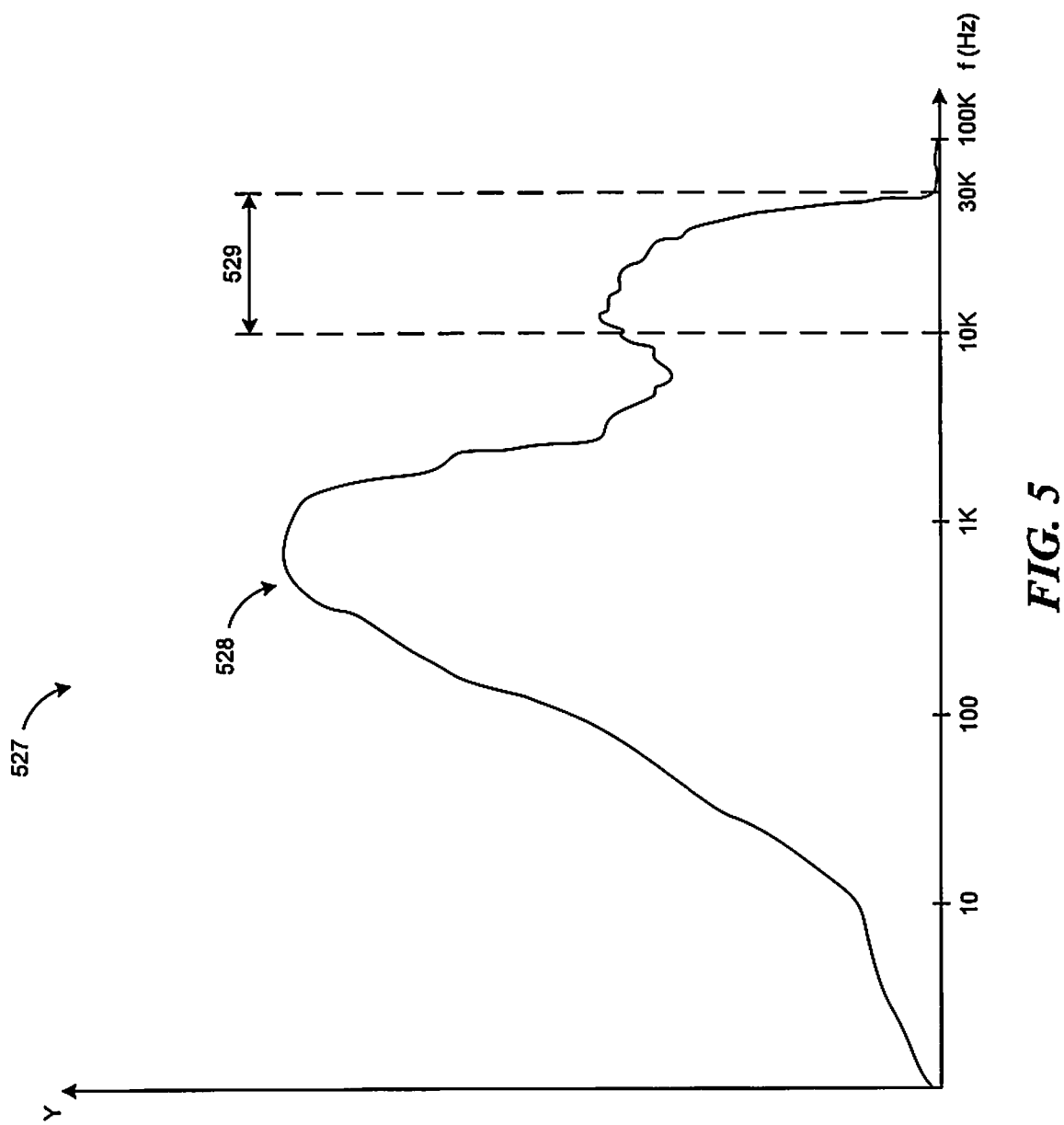
FIG. 5 is a logarithmic graph of a hypothetical received audio signal.

The power detector 426 measures the power of signal F_OUT and generates signal NOISE_P_OUT. Power may be measured in total Volts, Watts, Amperes, or any other valid measure of a signal. In one embodiment, power detector 426 rectifies the signal F_OUT in order to measure the power. FIG. 5 shows a hypothetical graph 527 of a received signal 528. After passing through band-pass filter 424 with passband frequency from about 10 kHz to 30 kHz, the remaining filtered signal 529 will theoretically include only the noise portion of SIGNAL_IN. Power detector 426 may determine the power of F_OUT by, for example, integrating over the length of the signal from 10 kHz to 30 kHz. In other embodiments, power detector 426 may determine the noise power by integrating over the entire signal F_OUT. One skilled in the art will recognize that the signal power may be measured by any acceptable means.

The full signal block 330 may measure the power of the entire signal SIGNAL_IN to generate signal SIGNAL_P_OUT through means similar to that which is employed by power detector 426. For example, full signal block 330 may include a power detector which rectifies and measures the power of signal SIGNAL_IN. Full signal block 330 may measure the power of signal SIGNAL_IN by integrating over the entire length of signal SIGNAL_IN. Full signal block 330 may measure power in total Volts, Watts, Amperes, or any other valid measure of a signal. One skilled in the art will recognize that full signal block 330 may measure power by any acceptable means.

Figure 6:
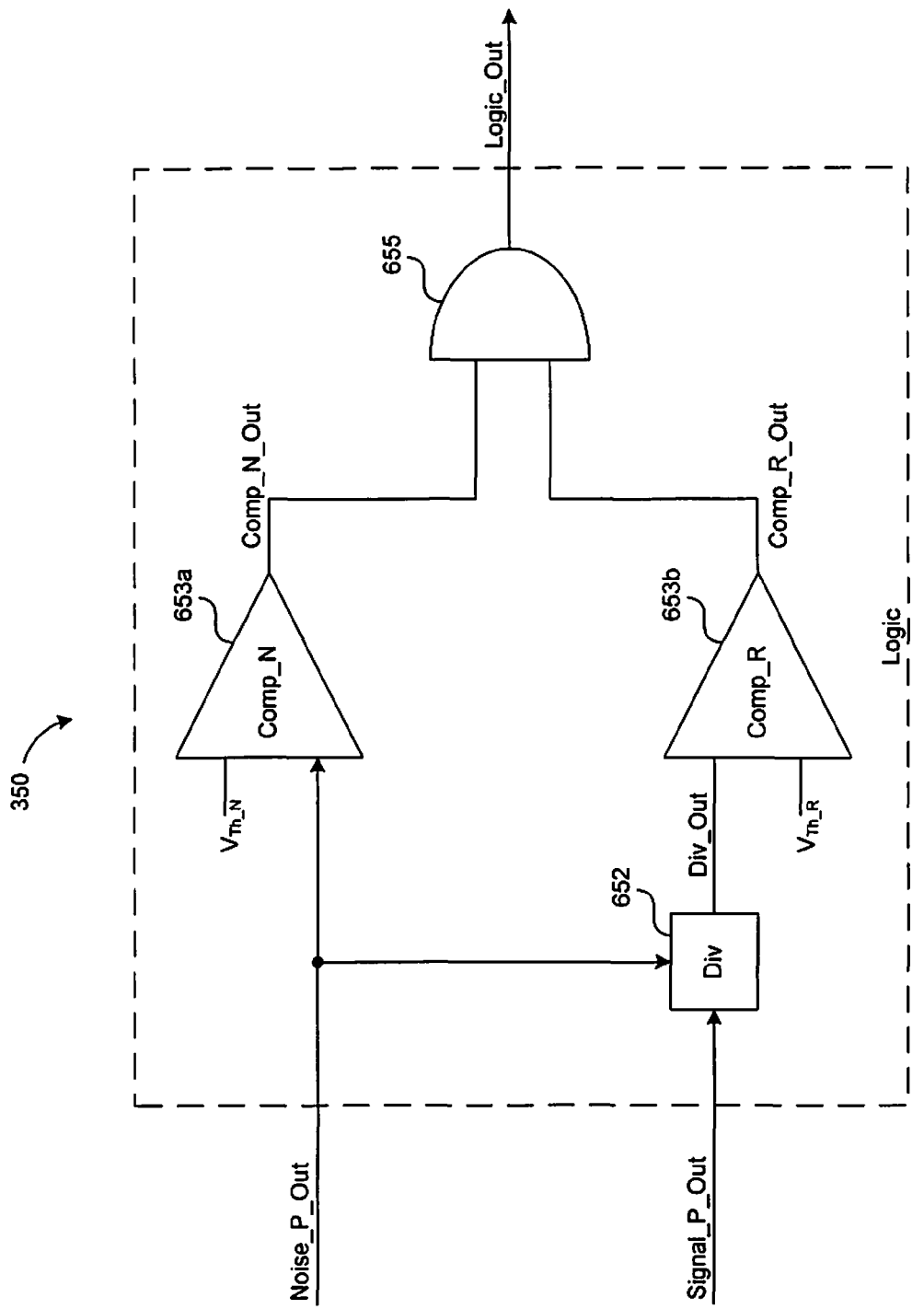
FIG. 6 is a diagram of a logic block usable in the squelch system of FIG. 2 in accordance with an embodiment of the invention.

FIG. 6 is a diagram of a logic block 350 suitable for use in a squelch system 300 consistent with an embodiment of the invention. In one embodiment, the logic block 350 includes a divider 652, a first comparator 653a, a second comparator 653b, and a logic gate 655. Divider 652 computes the ratio of signal NOISE_P_OUT and signal SIGNAL_P_OUT, and generates signal DIV_OUT. First comparator 653a receives as inputs NOISE_P_OUT and threshold voltage $V_{Th\_N}$, and generates signal COMP_N_OUT. Second comparator 653b receives as inputs signal DIV_OUT and threshold voltage $V_{Th\_R}$, and generates signal COMP_R_OUT.

In one embodiment, first and second comparators 653a and 653b are simple comparators with hysteresis. In such an embodiment, for example, first comparator 653a may output a voltage equivalent to logic '1' if NOISE_P_OUT is larger than $V_{Th\_N}$. In other embodiments, comparators 653a and 653b may be any device, circuit, program, and/or the like, which can receive as inputs a first voltage and a threshold voltage, and generate a signal based upon a comparison of the inputs. Alternatively, comparators 653a and 653b may be any device, circuit, program, and/or the like, which has an inherent threshold voltage and which will generate a signal based upon an input signal. $V_{Th\_N}$ and $V_{Th\_R}$ may be static values, or alternatively, $V_{Th\_N}$ and/or $V_{Th\_R}$ may vary based on, for example, the input signal SIGNAL_IN to the squelch system 300. In other embodiments, $V_{Th\_N}$ and $V_{Th\_R}$ are manually adjusted. Additionally, first and second comparators 653a and 653b and divider 652 may accept input signals that are measured in units other than Volts. For example, if noise power detector 426 measures the power of F_OUT in Amperes, first comparator 653a may be configured to receive such a signal.

Logic block 350 also includes logic gate 655, which receives as inputs signal COMP_N_OUT and signal COMP_R_OUT, and generates signal LOGIC_OUT. As displayed in FIG. 6, in one embodiment logic gate 655 performs the AND function. However, in other embodiments logic gate 655 performs the OR function, or another logic function. As explained above, the output of the logic block 350, signal LOGIC_OUT, is connected to the gain control block 340.

Figure 7:
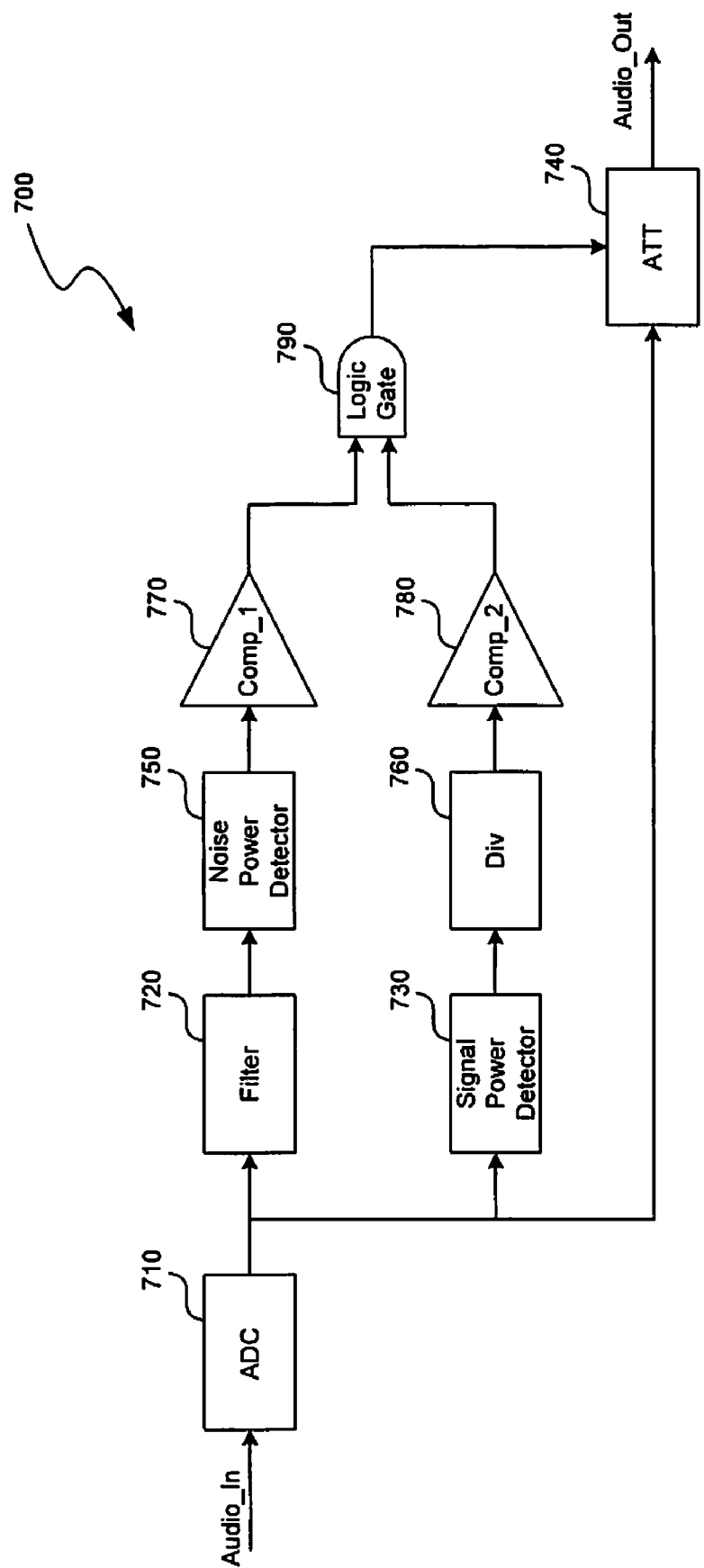
FIG. 7 is a diagram of a squelch device in accordance with an embodiment of the invention.

FIG. 7 is a diagram of a squelch device 700 in accordance with an embodiment of the invention. The squelch device 700 is an expansion of the squelch system 300 from FIG. 3, and features an analog to digital converter (ADC) 710 to convert signal AUDIO_IN into a digital signal. ADC 710 may be any analog to digital converter having a properly selected dynamic range and number of bits. ADC 710 may, for example, produce a digital signal having 10 bits.

Filter 720 receives the digital signal produced by ADC 710. Filter 720 filters the usable signal portion and passes the noise portion. Signal power detector 730 and gain control block ATT 740 also receive the digital signal produced by ADC 710.

Power detectors 730 and 750 measure the power of their respective input signals. As mentioned, signal power detector 730 receives as input the digital signal produced by ADC 710. Thus, signal power detector 730 measures the power of the entire digital signal. Noise power detector 750, on the other hand, receives the output of filter 720. As mentioned, filter 720 passes only the noise portion of the digital signal produced by ADC 710. Thus, noise power detector 720 measures the power of only a filtered portion of the digital signal.

Divider 760 computes the ratio of the noise power to total signal power, and thus receives as inputs the output from the noise power detector 750 and the output from the signal power detector 730. Comparators 770 and 780 are simple comparators with hysteresis. First comparator 770 receives as an input the output from the noise power detector 750. Second comparator 780 receives as an input the output of divider 760. Either comparator 770 or 780 will output logic '1' if its respective received signal is beyond a certain threshold.

Logic gate 790 performs the AND function. Thus, logic gate 790 will output logic '1' if both the noise power is beyond a certain threshold and the ratio of noise power to total signal power is beyond a certain threshold. As mentioned above, ATT 740 receives the digital signal produced by ADC 710 as an input. ATT 740 also receives the output of logic gate 790 as an input. Gain control block ATT 740 has a programmable gain, for example, from −40 dB to 0 dB in 2 dB steps. ATT 740 therefore generates a digital signal output from the digital signal produced by ADC 710, based on the output from logic gate 790.

One skilled in the art will appreciate the squelch device 700 for its reliable squelch engagement. The device 700 decides whether to squelch a signal based on two criteria: the out-of-band noise level and the ratio of the out-of-band noise power to the entire signal power. By considering both criteria, the squelch device 700 is relatively insensitive to the audio signal frequency and does not discriminate against a quite talker.

One skilled in the art will appreciate that the device 700 described with respect to FIG. 7 may be practiced in the analog domain. Thus, ADC 710 would be unnecessary and the components of the squelch device 700 would be configured to operate with analog signals.

While the above description describes certain embodiments of the invention, and describes the best mode contemplated, no matter how detailed the above appears in text, the invention can be practiced in many ways. Details of the system may vary in implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims.

We claim:

1. A method of attenuating an input signal in a communications device, the method comprising:
   receiving an input signal;
   filtering the input signal to form a filtered signal;
   measuring a power of the filtered signal and a power of the input signal;
   determining a ratio between the power of the filtered signal and the power of the input signal; and
   selectively attenuating the input signal based on the determined ratio and the power of the filtered signal.

2. The method of claim 1, wherein the input signal is an audio signal and is received from one of a cordless telephone base station or a microphone.

3. The method of claim 1, wherein the input signal is received by a digital signal processor.

4. The method of claim 1, wherein the power of the input signal and the power of the filtered signal are measured in one of Volts, Watts, or Amperes.

5. The method of claim 1, wherein selectively attenuating the input signal further comprises attenuating the input signal if the determined ratio is greater than a first predetermined value and the power of the filtered signal is greater than a second predetermined value.

6. The method of claim 1, wherein selectively attenuating the input signal further comprises attenuating the input signal if the determined ratio is less than a first predetermined value and the power of the filtered signal is less than a second predetermined value.

7. The method of claim 1, wherein the filtered input signal is a noise portion of the input signal.

8. The method of claim 2, wherein the microphone is part of a cordless telephone.

9. The method of claim 1, wherein filtering the input signal includes filtering out a usable portion of the input signal.

10. The method of claim 1, wherein the power of the input signal is compared to a first value and the power of the filtered input signal is compared to a second value.

11. An apparatus for attenuating an input signal in a communications device, the apparatus comprising:
- a filter configured to filter an input signal and to provide a filtered input signal;
- a first power detector configured to determine a power of a filtered input signal;
- a second power detector configured to determine a power of the input signal;
- a logic unit configured to generate a control signal based on the power of the filtered input signal and the power of the input signal; and
- a gain control unit configured to receive the control signal and to selectively attenuate the input signal.

12. The apparatus of claim 11 wherein the logic unit comprises:
- a divider configured to provide a ratio of the power of the filtered input signal and the power of the input signal;
- a first and a second comparator; and
- an AND gate.

13. The apparatus of claim 11, wherein the first power detector and the second power detector are configured to detect one of Volts, Watts, or Amperes.

14. The apparatus of claim 12, wherein the first comparator is configured to receive the ratio of the power of the filtered input signal and the power of the input signal, and the second comparator is configured to receive the power of the filtered input signal.

15. The apparatus of claim 12, wherein the gain control unit is configured to receive the output of the AND gate.

16. The apparatus of claim 12, further comprising an analog to digital converter configured to generate a digital audio signal.

17. The apparatus of claim 16, wherein the analog to digital converter is configured to receive an analog signal from one of a cordless telephone base station or a microphone.

18. An apparatus for attenuating an input signal in a communications device, the apparatus comprising:
- means for receiving an input signal;
- means for filtering the input signal to generate a filtered input signal;
- means for measuring a power of the filtered input signal and a power of the input signal;
- means for determining a ratio between the power of the filtered input signal and the power of the input signal; and
- means for selectively attenuating the input signal based on the determined ratio and the power of the filtered signal.

19. The apparatus of claim 18, further comprising:
- means for generating a first comparator signal based on a comparison of a first predetermined value and the determined ratio; and
- means for generating a second comparator signal based on a comparison of a second predetermined value and the power of the filtered signal.

20. The apparatus of claim 19, further comprising means for generating an attenuation control signal if the determined ratio is larger than the first predetermined value and the power of the filtered signal is larger than the second predetermined value.

* * * * *